United States Patent
Stoppelmann (10) Patent No.: US 10,633,538 B2
(45) Date of Patent: Apr. 28, 2020

(54) PLASTICS MOULDING COMPOSITION AND USE THEREOF

(71) Applicant: EMS-PATENT AG, Domat/Ems (CH)

(72) Inventor: Georg Stoppelmann, Bonaduz (CH)

(73) Assignee: EMS-PATENT AG, Domat/Ems (CH)

( * ) Notice: Subject to any disclaimer, the term of this patent is extended or adjusted under 35 U.S.C. 154(b) by 656 days.

(21) Appl. No.: 14/571,661

(22) Filed: Dec. 16, 2014

(65) Prior Publication Data

US 2015/0175803 A1 Jun. 25, 2015

(30) Foreign Application Priority Data

Dec. 20, 2013 (EP) .................................. 13199139

(51) Int. Cl.
*C08L 77/06* (2006.01)
*H05K 5/02* (2006.01)
(Continued)

(52) U.S. Cl.
CPC ............... *C08L 77/06* (2013.01); *C08K 3/22* (2013.01); *C08K 3/30* (2013.01); *C08K 3/32* (2013.01);
(Continued)

(58) Field of Classification Search
CPC .. C08L 77/06; C08L 2201/02; C08L 2203/20; C08L 2205/025; C08L 2205/16;
(Continued)

(56) References Cited

U.S. PATENT DOCUMENTS 4,268,432 A 5/1981 Maslen et al.
4,923,924 A * 5/1990 Grant .................... C08F 283/08
525/132

(Continued)

FOREIGN PATENT DOCUMENTS

CN 101861357 A 10/2010
EP 1 274 288 A 1/2003
(Continued)

OTHER PUBLICATIONS

Azom (Azom, "E-Glass Fibre," 2001, p. 1-3, http://www.azom.com/article.aspx?ArticleID=764, accessed Mar. 25, 2016).*
(Continued)

*Primary Examiner* — Gerard Higgins
*Assistant Examiner* — Kevin C Ortman, Jr.
(74) *Attorney, Agent, or Firm* — Sughrue Mion, PLLC (57) ABSTRACT

A description is given of thermoplastic, white-pigmented plastics moulding compositions having improved mechanical properties, especially for LDS applications. The thermoplastic moulding composition consists of:
(A) 20-88 wt % of a mixture consisting of
  (A1) 60-100 wt % of a thermoplastic
  (A2) 0-40 wt % of a mixture of
    (A2_1) 0-40 wt % of a thermoplastic other than (A1);
    (A2_2) 0-40 wt % of impact modifiers other than (A1) and (A2_1);
(B) 10-70 wt % of fibrous adjuvants;
(C) 0.1-10 wt % of an LDS additive or of a mixture of LDS additives, at least one LDS additive being selected from the following group: metal oxide based on copper, neodymium, molybdenum, bismuth, antimony or tin, with the proviso that spinels are excluded; metal phosphate; metal hydroxide phosphate;
(Continued)

(D) 0.1-20 wt % of white pigment;
(E) 0-20 wt % of particulate filler other than C and/or D;
(F) 0-2 wt % of further, different additives;
the sum of (A)-(F) making up 100 wt %.

15 Claims, 1 Drawing Sheet (51) Int. Cl.
*C08L 77/02* (2006.01)
*C08K 3/32* (2006.01)
*C08K 3/22* (2006.01)
*C08K 3/30* (2006.01)
*C08K 7/14* (2006.01)
*C08L 77/00* (2006.01)
*C08K 3/24* (2006.01)
*C08K 7/02* (2006.01)

(52) U.S. Cl.
CPC .............. *C08K 7/14* (2013.01); *C08L 77/02* (2013.01); *H05K 5/0247* (2013.01); *C08K 3/24* (2013.01); *C08K 7/02* (2013.01); *C08K 2003/2241* (2013.01); *C08K 2003/3036* (2013.01); *C08L 77/00* (2013.01); *C08L 2203/20* (2013.01); *C08L 2205/025* (2013.01); *C08L 2205/03* (2013.01); *C08L 2205/16* (2013.01); *Y10T 428/1352* (2015.01)

(58) Field of Classification Search
CPC . C08K 13/04; C08K 3/24; C08K 3/32; C08K 2003/328; C08K 2003/327; C08K 7/14; C08K 5/34928; H05K 5/0247; Y10T 428/1352

USPC .......... 428/36.9, 220, 35.7, 402, 523, 318.6, 428/333, 337, 339, 35.8, 375, 418, 423.1, 428/425.1, 425.8, 426, 437, 507, 516, 96; 524/222

See application file for complete search history.

(56) References Cited

U.S. PATENT DOCUMENTS

| | | | |
|---|---|---|---|
| 6,291,633 B1 | 9/2001 | Nakamura | |
| 2010/0279111 A1* | 11/2010 | Philipp | .................... C08J 5/043 |
| | | | 428/357 |
| 2013/0289178 A1* | 10/2013 | Li | ........................... C08L 69/00 |
| | | | 524/127 |
| 2014/0206800 A1* | 7/2014 | Wu | ......................... C08K 3/22 |
| | | | 524/127 |
| 2015/0247243 A1 | 9/2015 | Takano et al. | |

FOREIGN PATENT DOCUMENTS

| | | |
|---|---|---|
| EP | 2 711 399 A1 | 3/2014 |
| JP | 52155659 A | 12/1977 |
| JP | 2000204241 A | 7/2000 |
| JP | 2010037372 A | 2/2010 |
| JP | 2010260889 A | 11/2010 |
| JP | 2011503307 A | 1/2011 |
| JP | 2011-132550 A | 7/2011 |
| JP | 2011174051 A | 9/2011 |
| WO | 2012/056416 A1 | 5/2012 |
| WO | 2013/076314 A1 | 5/2013 |
| WO | 2013/141157 A1 | 9/2013 |
| WO | 2013/183789 A1 | 12/2013 |
| WO | 2014/042071 A1 | 3/2014 |
| WO | 2014/042284 A1 | 3/2014 |

OTHER PUBLICATIONS

European Search Report for EP 13 199 139.0 dated Jun. 6, 2014. XP-002725098.

* cited by examiner

«PLASTICS MOULDING COMPOSITION AND USE THEREOF

TECHNICAL FIELD

The present invention relates to thermoplastic moulding compositions having improved mechanical properties. Besides glass fibres, the moulding compositions comprise a white pigment and also an LDS additive. Mouldings produced therefrom can be subjected, following partial irradiation, to targeted metallization. The moulding compositions of the invention find use in particular for the production of injection-moulded circuit carriers.

PRIOR ART

Moulded Interconnect Devices (MIDs)—circuit carriers made from thermoplastics—have the advantage over existing circuit carriers of improved design freedom, of effective environmental compatibility, and of the rationalization potential relating to the process of producing the end product. The integration of electrical and mechanical functions in an injection moulding may lead to miniaturization of the assembly. Moreover, entirely new functions can be realized, and virtually any desired forms can be designed. 2-Component injection moulding, hot stamping and subtractive laser structuring are MID fabrication technologies that have already been used for a number of years in production-line fabrication.

Likewise known, from EP-A-1 274 288, is the additive laser structuring technology (Laser Direct Structuring, LDS), in which a laser is used to structure the moulding produced by the standard injection moulding process. As a result of this laser structuring, the regions on the surface of the plastic that are later to carry the conduction tracks are seeded partially with metal atoms, atop which subsequently a metal layer grows in chemically reductive metalizing baths. The metal seeds come about by breakdown of metal compounds present in ultra-finely divided form in the carrier material. Particularly suitable metal compounds for laser direct structuring are copper-containing metal oxides with spinel structure. Unirradiated regions of the plastic are retained unchanged in the metalizing bath. In the sole example of EP-A-1 274 288, the moulding composition, composed of 70 wt % of polybutylene terephthalate, 30 wt % of silica and 5 wt % of a copper-chromium spinel, is processed to form a housing for a mobile telephone, which is irradiated through an Nd-YAG laser and is subsequently metallized in a reductive copper-plating bath. WO-A-2013/076314 describes thermoplastic moulding compounds which are directly structurable with a laser and which comprise as their LDS additive a mixed metal oxide based on tin and a further metal from a defined group, and the patent shows, on the basis of non-reinforced moulding compounds composed of polycarbonate or of polycarbonate-ABS blends, that these moulding compositions possess high whiteness and that the metalizing can be improved as the fraction of antimony oxide increases.

Likewise for blends based on non-reinforced and non-flame-retarded polycarbonate/ABS, WO-A-2012/056416 indicates that the addition of titanium dioxide, irrespective of the type of LDS additive used, can lead to moulding compositions with good whiteness. WO 2013183789 discloses a resin composition with excellent mechanical strength that retains the LDS activity. Based on 100 parts by weight of a polycarbonate resin component, the resin composition for laser direct structuring comprises 10 to 100 parts by weight of a glass filler and 1 to 30 parts by weight of an additive for laser direct structuring, the polycarbonate resin component consisting of 80 to 30 wt % of a polycarbonate resin and 20 to 70 wt % of a styrene-based resin, or consisting of a polycarbonate, and the laser direct structuring additive being based on antimony and tin. WO 2013141157 discloses a thermoplastic resin composition with high heat resistance during welding, with excellent coating qualities, even after aging treatment, and with a high reflectivity. The thermoplastic resin composition comprises the following: 10-80 parts by weight of a glass filler (B), 1-30 parts by weight of a laser direct structuring additive (C) with 25% or more reflectivity at a wavelength of 450 nm, and 20-150 parts by weight of titanium oxide (D), based on 100 parts by weight of a crystalline thermoplastic resin (A) having a melting point of 250° C. or more.

DESCRIPTION OF THE INVENTION

On this basis it was an object of the present invention to provide thermoplastic moulding compositions, more particularly polyamide moulding compositions, and more particularly those which as well as glass fibres also include white pigments and LDS additives, suitable for the MID technology, permitting the production of mouldings having good mechanical properties, in particular with high stiffness, high tensile strength, and good impact toughness, that exhibit high colour lightness L* and good colourability and that do not have the disadvantages of the prior art. Furthermore, following laser irradiation, the mouldings are to be very amenable to metallization, and the conductor tracks are to have good adhesion on the polymer substrate.

The thermal and mechanical properties and also the associated fields of use of these circuit carriers are determined first and foremost by the underlying thermoplastic moulding composition. Polyamides are presently widespread as structural elements for the interior and exterior, this being attributable essentially to the outstanding mechanical properties.

An improvement in the mechanical properties, such as strength and stiffness, can be achieved in particular through the addition of fibrous reinforcing materials, such as glass fibres or carbon fibres. In many cases, along with the glass fibres, particulate fillers are used as well, whether in order to colour the moulding compositions with inorganic pigments or to undertake specific modifications to properties.

The laser direct structurable moulding compositions comprise additives known as laser additives, which liberate metals upon exposure to electromagnetic rays. Employed frequently for this laser-induced seeding are metal oxides, especially spinels. In order to increase the micro roughness and hence the adhesion of the subsequently applied conductor track, such moulding compositions may further comprise considerable amounts of other fillers too, such as talc. Through the addition of particulate fillers or white pigments to the glass fibre-reinforced moulding compositions, however, the mechanical properties are generally impaired significantly—in particular, the tensile strength, the elongation at break and the impact strength suffer reduction. A consequence of this is that in conjunction with glass fibres, little or no particulate fillers can be employed if the stiffness, the tensile strength and the impact strength are deemed to be critical parameters for the moulding.

The addition of the particulate fillers and white pigments, needed for MID moulding compositions, to glass fibre-reinforced moulding compositions does produce the functionality of laser structurability and of conductor track adhesion in conjunction with a light intrinsic colour, but at the same time it leads to a deterioration in terms of the mechanical properties, such as the tensile strength and the toughness. The present invention is to be seen in the context of this dichotomy.

Specifically the invention relates to a moulding composition, in particular with high stiffness, tensile strength and impact toughness, and also with light intrinsic colour (high colour lightness L*) and good colourability, according to Claim 1, in particular consisting of:
(A) 20-88 wt % of a mixture consisting of
  (A1) 60-100 wt % of a thermoplastic or of a mixture of thermoplastics;
  (A2) 0-40 wt % of a mixture of
    (A2_1) 0-40 wt % of a thermoplastic other than (A1), or of a mixture of thermoplastics other than (A1);
    (A2_2) 0-40 wt % of impact modifiers other than (A1) and (A2_1);
  the sum of components (A1), (A2_1) and (A2_2) adding up to 100 wt % of component (A);
(B) 10-70 wt % of fibrous adjuvants;
(C) 0.1-10 wt % of an LDS additive or of a mixture of LDS additives, at least one LDS additive being selected from the following group: metal oxide based on antimony, copper, neodymium, molybdenum, bismuth and/or tin, with the proviso that spinels are excluded;
  metal phosphate, preferably alkaline metal phosphate; metal hydroxide phosphate; preferably based on inorganic compounds of copper and/or of tin, such as preferably tin oxide, more preferably antimony-doped tin oxide, more particularly a mica coated with antimony-doped tin oxide;
(D) 0.1-20 wt % of white pigment;
(E) 0-20 wt % of particulate filler other than C and/or D;
(F) 0-2 wt % of further, different additives;
the sum of (A)-(F) making up 100 wt %.
Here, preferably, component (A) consists of:
(A1) 60-100 wt % of a mixture consisting of
  (A1_1) 40-100, preferably 50-95 wt % of aliphatic polyamide, which may be a homo- or copolyamide, and
    either preferably is based exclusively on lactam and/or aminocarboxylic acid, and/or diamine and dicarboxylic acid, units having not more than 6 carbon atoms, more preferably exclusively on diamine and dicarboxylic acid units having not more than 6 carbon atoms,
    or is based preferably exclusively from lactam and/or aminocarboxylic acid, and/or diamine and dicarboxylic acid units having more than 6 carbon atoms, more preferably exclusively on diamine and dicarboxylic acid units having more than 6 carbon atoms;
  (A1_2) 0-60, preferably 5-50 wt % of amorphous, partially aromatic polyamide, the sum of components (A1_1) and (A1_2) adding up to 100 wt % of component (A1);
(A2) 0-40 wt % of a mixture consisting of
  (A2_1) 0-40 wt % of thermoplastic other than (A1)
  (A2_2) 0-40 wt % of impact modifiers other than (A1) and (A2_1)
the sum of components (A1), (A2_1) and (A2_2) adding up to 100 wt % of component (A). Component (A2_1) here may be selected from the group consisting of the following: polyamide, polycarbonate, polystyrene, polymethyl methacrylate, acrylonitrile-butadiene-styrene copolymer, acrylonitrile-styrene copolymer, polyolefin, polyoxymethylene, polyesters, especially polyethylene terephthalate, polybutylene terephthalate, polysulphone, especially of type PSU, PESU, PPSU, polyphenylene ethers, polyphenylene sulphide, polyphenylene oxide, liquid-crystalline polymers, polyether ketone, polyether ether ketone, polyimide, polyamideimide, polyesterimide, polyetheramide, polyesteramide, polyetheresteramide, polyurethane, especially of type TPU, PUR, polysiloxane, polyacrylate, polymethacrylate, and also mixtures or copolymers based on such systems. Such systems (A1) may further be used preferably in combination with the impact modifiers specified below, a preferred embodiment of component A2. Preferentially component (A1) consists entirely of polyamide or of a mixture of different polyamides. Preferentially the fraction of component (A) is in the range of 25-84 wt %, preferably in the range of 30-80 wt %, and preferably also the total fraction of (A) in the form of polyamide (A1) is in the range of 25-84 wt %, especially preferably in the range of 30-80 wt %.

The fraction of component (A2_1) is preferably in the range of 5-40 wt %, preferably in the range of 5-30 wt % or in the range of 5-20 wt %, based in each case on the sum of components (A1), (A2_1) and (A2_2).

The fraction of the further matrix component (A2) as a whole within component (A) and based on the total amount of component (A) is preferentially in the range of 0-20 wt %, preferably in the range of 0-10 wt % or in the range of 5-15 wt %. Preferentially, however, there is no further matrix component (A2), i.e., preferentially, only component (A1) is present in the moulding composition.

In a further embodiment, the moulding composition of the invention comprises as component (A2_2) up to 40 wt % of one or more impact modifiers (IM). Preference is given to an IM concentration in the range between 5 and 40 wt %, more particularly of 5-30 wt %. Where components A2_1 and A2_2 are used together, the ratio A2_1:A2_2 is at least 1:1, preferably 1.2:1, more preferably 1.5:1, and is therefore in the range from 1:1 to 1:10, preferably in the range from 1.2:1 to 1:10, more preferably in the range from 1.5:1 to 1:8.

Generally speaking, component (A2_2) may be selected from the group consisting of the following: olefin polymers, low-density, medium-density and high-density polyethylenes, polypropylene, polybutadiene, poly-4-methylpentene, ethylene-propylene block copolymers or random copolymers, ethylene-methylhexadiene copolymers, propylene-methylhexadiene copolymers, ethylene-propylene-butene copolymers, ethylene-propylene-hexene copolymers, ethylene-propylene-methylhexadiene copolymers, poly(ethylene-vinyl acetate) (EVA), poly(ethylene-ethyl acrylate) (EEA), ethylene-octene copolymer, ethylene-butene copolymer, ethylene-hexene copolymer, ethylene-propylene-diene terpolymers, and also combinations of the stated polymers, preferably functionalized with acid anhydride groups.

The fraction of component (A2_2) can be in the range of 5-40 wt %, preferably in the range of 5-30 wt % or in the range of 5-20 wt %, based in each case on the sum of components (A1), (A2_1) and (A2_2).

The IM may be a natural rubber, polybutadiene, polyisoprene, polyisobutylene, a copolymer of butadiene and/or of isoprene with styrene or styrene derivatives and other comonomers, a hydrogenated copolymer and/or a copolymer formed by grafting or copolymerization with acid anhydrides, (meth)acrylic acid and esters thereof. The impact modifier (A2_2) may also be a graft rubber with a crosslinked elastomeric core which consists of butadiene, isoprene or alkyl acrylates and has a graft shell of polystyrene, or may be a non-polar or polar olefin homopolymer and copolymer such as ethylene-propylene, ethylene-propylene-diene and ethylene-octene or ethylene-vinyl acetate rubber, or may be a non-polar or polar olefin homopolymer and copolymer formed by grafting or copolymerization with acid anhydrides, (meth)acrylic acid and esters thereof. The impact modifier (A2_2) may also be a carboxylic acid-functionalized copolymer such as poly(ethene-co-(meth)acrylic acid) or poly(ethene-co-1-olefin-co-(meth)acrylic acid), in which case the 1-olefin may be an alkene or unsaturated (meth)acrylic ester having more than 4 atoms, including copolymers in which some of the acid groups are neutralized with metal ions.

Preferred impact modifiers of component (A2_2) based on styrene monomers (styrene and styrene derivatives) and on other vinyl aromatic monomers are block copolymers based on alkenyl aromatic compounds and a conjugated diene, and also hydrogenated block copolymers from an alkenyl aromatic compound and conjugated dienes, or combinations of these IM types. The block copolymer comprises at least one block derived from an alkenyl aromatic compound (A) and at least one block derived from a conjugated diene (B). In the hydrogenated block copolymers, the fraction of aliphatically unsaturated carbon-carbon double bonds has been reduced by hydrogenation. Suitable block copolymers are two-, three-, four- and poly-block copolymers with a linear structure. However, branched and star-shaped structures can likewise be employed. Branched block copolymers are obtained in a conventional way, by—for example—grafting reactions of polymeric "side arms" onto a polymer main chain. Alkenyl aromatic monomers used, as well as or in a mixture with styrene, are vinyl aromatic monomers, substituted on the aromatic ring and/or on the C=C double bond by C1-20 hydrocarbon radicals or halogen atoms.

Examples of alkenyl aromatic monomers are styrene, p-methylstyrene, $\alpha$-methylstyrene, ethylstyrene, tert-butylstyrene, vinyltoluene, 1,2-diphenylethylene, 1,1-diphenylethylene, vinylxylenes, vinyltoluenes, vinylnaphthalenes, divinylbenzenes, bromostyrenes, chlorostyrenes, and combinations thereof. Preferred are styrene, p-methylstyrene, alpha-methylstyrene and vinylnaphthalene.

Examples of diene monomers contemplated are 1,3-butadiene, 2-methyl-1,3-butadiene, 2,3-dimethyl-1,3-butadiene, 1,3-pentadiene, 1,3-hexadiene, isoprene, chloroprene and piperylene. 1,3-Butadiene and isoprene are preferred, especially 1,3-butadiene (identified hereinafter for short as butadiene).

Preference is given to using styrene as alkenyl aromatic monomer and butadiene as diene monomer; in other words, preference is given to the styrene-butadiene block copolymer. In general the block copolymers are prepared by anionic polymerization in a conventional way.

Furthermore, as well as the styrene and diene monomers, further comonomers may be used as well. The fraction of the comonomers is preferably 0 to 50, more preferably 0 to 30 and particularly 0 to 15 wt %, based on the total amount of the monomers used. Examples of suitable comonomers are acrylates, especially C1-12 alkyl acrylates such as n-butyl acrylate or 2-ethylhexyl acrylate, and the corresponding methacrylates, especially C1-12 alkyl methacrylates such as methyl methacrylate (MMA). Further possible comonomers are (meth)acrylonitrile, glycidyl(meth)acrylate, vinyl methyl ether, diallyl and divinyl ethers of difunctional alcohols, divinylbenzene and vinyl acetate.

Further to the conjugated diene, the hydrogenated block copolymers of component (A2) optionally also comprise fractions of lower hydrocarbons such as ethylene, propylene, 1-butene, dicyclopentadiene or non-conjugated dienes, for example. In the hydrogenated block copolymers, the fraction of non-reduced aliphatic unsaturated bonds resulting from the block B is less than 50%, preferably less than 25%, more particularly less than 10%. The aromatic fractions from block A are reduced to an extent of not more than 25%. The hydrogenated block copolymers styrene-(ethylene-butylene) diblock and styrene-(ethylene-butylene)-styrene triblock copolymers are obtained by hydrogenation of styrene-butadiene and styrene-butadiene-styrene copolymers. The block copolymers consist preferably to an extent of 20 to 90 wt % of block A, more particularly 50 to 85 wt % of block A. The diene may be installed in 1,2 or in 1,4 orientations in the block B.

Examples of non-hydrogenated block copolymers are polystyrene-polybutadiene, polystyrene-poly(ethylene-propylene), polystyrene-polyisoprene, poly($\alpha$-methylstyrene)-polybutadiene, polystyrene-polybutadiene-polystyrene (SBS), polystyrene-poly(ethylene-propylene)-polystyrene, polystyrene-polyisoprene-polystyrene and poly($\alpha$-methylstyrene-polybutadiene-poly($\alpha$-methylstyrene), and also combinations thereof.

Suitable non-hydrogenated block copolymers which are available commercially are various products with the brand names SOLPRENE® (Phillips), KRATON® (Shell), VECTOR® (Dexco) and SEPTON® (Kuraray).

According to another preferred embodiment, the moulding compositions of the invention are characterized in that component (A2_2) is a polyolefin homopolymer or an ethylene-$\alpha$-olefin copolymer, especially preferably an EP and/or EPDM elastomer (ethylene-propylene rubber and ethylene-propylene-diene rubber, respectively). Thus it may be, for example, an elastomer which is based on an ethylene-C3-12 $\alpha$-olefin copolymer with 20 to 96, preferably 25 to 85, wt % of ethylene, in which case, with particular preference, the C3-12 $\alpha$-olefin is an olefin selected from the group of propene, 1-butene, 1-pentene, 1-hexene, 1-octene, 1-decene and/or 1-dodecene, and especially preferably component C is ethylene-propylene rubber and/or LLDPE and/or VLDPE.

Alternatively or additionally (for example in a mixture), (A2) may comprise a terpolymer based on ethylene-C3-12 $\alpha$-olefin with a non-conjugated diene, in which case it preferentially comprises 25 to 85 wt % of ethylene and up to at most in the region of 10 wt % of a non-conjugated diene, the C3-12 $\alpha$-olefin being with more particular preference an olefin selected from the group of propene, 1-butene, 1-pentene, 1-hexene, 1-octene, 1-decene and/or 1-dodecene, and/or the non-conjugated diene being preferably selected from the group of bicyclo[2.2.1]heptadiene, hexa-1,4-diene, dicyclopentadiene and/or, in particular, 5-ethylidenenorbornene.

Also suitable as a constituent for component (A2_2) are ethylene-acrylate copolymers. Other possible forms as constituents for component (A2_2) are the ethylene-butylene copolymers and/or mixtures (blends) which comprise such systems.

Component (A2_2) preferentially possesses constituents having acid anhydride groups, which are introduced by a thermal or radical reaction of the main chain polymer with an unsaturated dicarboxylic anhydride, with an unsaturated dicarboxylic acid or with an unsaturated dicarboxylic monoalkyl ester, in a concentration sufficient for effective attachment to the polyamide—for this purpose, reagents selected from the following group are preferentially employed: maleic acid, maleic anhydride, maleic monobutyl ester, fumaric acid, aconitic acid and/or itaconic anhydride.

Preferably, 0.1 to 4.0 wt % of an unsaturated anhydride are grafted onto the impact modifier component as a constituent of (A2_2), or the unsaturated dicarboxylic anhydride or precursor thereof is grafted on together with another unsaturated monomer. Generally speaking, the degree of grafting is preferentially in a range of 0.1-1.0%, especially preferably in a range of 0.3-0.7%. Also possible as a constituent of component (A2_2) is a mixture of an ethylene-propylene copolymer and an ethylene-butylene copolymer, having a degree of maleic anhydride grafting (degree of MAH grafting) in the range of 0.3-0.7%. The possible systems indicated above for the component may also be used in mixtures.

Furthermore, component (A2_2) may possess constituents which possess functional groups, such as carboxylic acid, ester, epoxy, oxazoline, carbodiimide, isocyanate, silanol and carboxylate groups, for example, or may comprise combinations of two or more of the stated functional groups. Monomers which carry these functional groups may be bonded to the elastomeric polyolefin through copolymerization or grafting. Furthermore, the IM based on the olefin polymers may also have been modified by grafting with an unsaturated silane compound, e.g. vinyltrimethoxysilane, vinyltriethoxysilane, vinyltriacetosilane, methacryloyloxypropyltrimethoxysilane or propenyltrimethoxysilane.

The elastomeric polyolefins are random, alternating or segmented copolymers with a linear, branched or core-shell structure, and contain functional groups which are able to react with the end groups of the polyamides, thus resulting in sufficient compatibility between polyamide and IM.

The IMs used as component (A2_2) therefore include homopolymers or copolymers of olefins, such as ethylene, propylene and but-1-ene, for example, or copolymers of olefins and copolymerizable monomers, such as vinyl acetate, (meth)acrylic esters and methylhexadiene.

Particularly preferred are the following olefin polymers: low-density, medium-density and high-density polyethylenes, polypropylene, polybutadiene, poly-4-methylpentene, ethylene-propylene block or random copolymers, ethylene-methylhexadiene copolymers, propylene-methylhexadiene copolymers, ethylene-propylene-butene copolymers, ethylene-propylene-hexene copolymers, ethylene-propylene-methylhexadiene copolymers, poly(ethylene-vinyl acetate) (EVA), poly(ethylene-ethyl acrylate) (EEA), ethylene-octene copolymer, ethylene-butene copolymer, ethylene-hexene copolymer, ethylene-propylene-diene terpolymers, and also combinations of the stated polymers. In particular it is preferred if these olefin polymers are functionalized with acid anhydride groups.

Commercially available impact modifiers which can be used as part of the constituents of component (A2_2) are as follows: TAFMER MC201, TAFMER MHSO10, TAFMER MH7010, TAFMER MH7020 from Mitsui Chemicals; EXXELOR VA1801, EXXELOR VA1803, EXXELOR VA1810, EXXELOR MDEX 94-11, Exxon Mobil Chemical; FUSABOND MN493D, FUSABOND A EB560D; ELVALOY, DuPont.

Also preferred is an ionomer in the context of component (A2), in which the polymer-bonded carboxyl groups are joined to one another wholly or partly by metal ions.

Particularly preferred are copolymers—functionalized with maleic anhydride by grafting—of butadiene with styrene, non-polar or polar olefin homopolymers and copolymers formed by grafting with maleic anhydride, and carboxylic acid-functionalized copolymers such as poly (ethene-co-(meth)acrylic acid) or poly(ethene-co-1-olefin-co-(meth)acrylic acid) in which some of the acid groups are neutralized with metal ions.

The moulding composition of the invention consists preferably of 20 to 88 wt % of a thermoplastic mixture (A) of polyamide (A1), and a non-polyamide-based thermoplastic (A2), the concentration of (A2) accounting for not more than 40 wt %, based on the mixture A. Component A1 in this case consists preferably of 50-100 wt % of aliphatic polyamides. Component (A1) more particularly is a mixture of partially crystalline, aliphatic polyamides (component A1_1) and of amorphous, partially aromatic polyamides (component A1_2), the fraction of aliphatic polyamide being at least 50 wt %, preferably at least 60 wt % and more preferably at least 65 wt %. The concentration of component (A1_2) here is in the range of 5-50 wt %, preferably in the range of 7-40 wt % and more preferably in the range of 10-35 wt %.

Component (A1) may therefore consist of aliphatic polyamide or of a polyamide mixture which comprises at least 60 wt % of aliphatic polyamide, preferably 60 to 93 wt % of aliphatic polyamide, based in each case on the total amount of component (A1). Component (A1) may also consist of a mixture of aliphatic polyamide (A1_1) and of amorphous, partially aromatic polyamide (A1_2).

The invention therefore, in particular, comprises a thermoplastic moulding composition consisting of:
(A) 25-84 wt % of a mixture (A) of
 (A1) 60-100 wt % of a mixture of
  (A1_1) 50-95 wt % of aliphatic polyamide;
  (A1_2) 5-50 wt % of amorphous, partially aromatic polyamide; the sum of (A1_1) and (A1_2) adding up to 100 wt % of component (A1);
 (A2) 0-40 wt % of a mixture of
  (A2_1) 0-40 wt % of a thermoplastic other than (A1);
  (A2_2) 0-40 wt % of impact modifiers other than (A1) and (A2_1); the sum of (A1), (A2_1) and (A2_2) adding up to 100 wt % of component (A);
(B) 15-60 wt % of fibrous adjuvants;
(C) 0.1-10 wt % of an LDS additive or mixture of LDS additives, at least one LDS additive being wholly or partly
  a metal oxide based on copper, neodymium, molybdenum, bismuth or tin, with spinels being excluded,
  a metal phosphate, alkaline metal phosphate or metal hydroxide phosphate, preferably based on inorganic compounds of copper and/or of tin,
  a tin oxide, preferably antimony-doped tin oxide, more particularly a mica coated with antimony-doped tin oxide;
(D) 0.5-10 wt % of white pigment, more particularly titanium dioxide, zinc oxide or zinc sulphide, more particularly zinc sulphide;
(E) 0-20 wt % of particulate filler other than C and D;
(F) 0-2 wt % of further, different additives; the sum of (A)-(F) making up 100 wt %.

The stated polyamides (A1) may be prepared from the following dicarboxylic acids: adipic acid, suberic acid, azelaic acid, sebacic acid, undecanedioic acid, dodecanedioic acid, tridecanedioic acid, tetradecanedioic acid, pentadecanedioic acid, hexadecanedioic acid, heptadecanedioic acid, octadecanedioic acid, C36 dimer fatty acid, isophthalic acid, terephthalic acid, naphthalenedicarboxylic acid, cis- and/or trans-cyclohexane-1,4-dicarboxylic acid and/or cis- and/or trans-cyclohexane-1,3-dicarboxylic acid (CHDA) and mixtures thereof.

Suitable diamines include the following monomers: 1,4-butanediamine, 1,5-pentanediamine, 2-methyl-1,5-pentanediamine, 2-butyl-2-ethyl-1,5-pentanediamine, 1,6-hexanediamine, 2,2,4-trimethylhexamethylenediamine, 2,4,4-trimethylhexamethylenediamine, 1,8-octanediamine, 2-methyl-1,8-octanediamine, 1,9-nonanediamine, 1,10-decanediamine, 1,11-undecanediamine, 1,12-dodecanediamine, 1,13-tridecanediamine, 1,14-tetradecanediamine, m-xylylenediamine and p-xylylenediamine.

The polyamides may also, furthermore, be constructed on the basis of lactams or aminocarboxylic acids, more particularly α,ω-amino acids or lactams having 6 to 12 carbon atoms, of which the following selection may be given by way of example: m-aminobenzoic acid, p-aminobenzoic acid, caprolactam (CL), ω-aminocaproic acid, ω-aminoheptanoic acid, ω-aminooctanoic acid, ω-aminononanoic acid, ω-aminodecanoic acid, ω-aminoundecanoic acid (AUA), laurolactam (LL) and ω-aminododecanoic acid (ADA). Particularly preferred are caprolactam, aminocaproic acid, laurolactam and aminododecanoic acid.

The polyamides A1_1 or A1_2 preferably have a solution viscosity $\eta_{rel}$, measured in m-cresol (0.5 wt %, 20° C.), in the range from 1.4 to 3.0, preferably in the range from 1.5 to 2.7, more particularly in the range from 1.5 to 2.4.

Aliphatic polyamides (A1_1) are preferably polyamide 46, polyamide 6, polyamide 66, polyamide 11, polyamide 12, polyamide 1212, polyamide 1010, polyamide 1012, polyamide 1112, polyamide 610, polyamide 612, polyamide 69, polyamide 810 or mixtures, blends, copolymers, or alloys thereof. Especially preferred is PA 1010 or polyamide 46, polyamide 6, and polyamide 66 and mixtures and also copolymers.

For the polyamides (A1_2), the copolyamides 6I/6T, 10I/10T, 12/6T, and MXD6/MXDI are preferred. Particularly preferred are the amorphous copolyamides 6I/6T, 10I/10T and 12/6T with a fraction of less than 50 mol % of 6T units. Preference is given in particular to PA 6I/6T and PA 10I/10T, with a composition range T:I of 20:80 to 45:55 being preferred. With regard to the copolyamides MXD6/MXDI, MXD6-rich compositions are preferred, especially those having an MXD6 content of greater than 80 mol %, more preferably in the range from 82 to 95 mol %. With particular preference component (A1_2) is selected from polyamide PA 10I/10T having an I:T ratio in the range from 75:25 to 50:50, preferably in the range from 70:30 to 55:45 and especially of 60:40. In comparison to copolyamide PA 6I/6T, the contraction transverse to the injecting direction is reduced significantly by PA 10I/10T (from 0.3% to 0.1%).

In relation to a polymer mixture comprising the polyamide components A1_1 and A1_2, the following compositions are preferred:
- (A1_1): PA 66 and/or PA6
- (A1_2): PA 6I/6T, where the molar ratio is in the range from 65:35 to 75:25 or more particularly is 67:33.
- (A1_1): mixture of PA 6 and PA66, in the ratio of 1:1 to 1:4, more particularly in the ratio of 1:3 to 1:4;
- (A1_2): PA 6I/6T, where the molar ratio is in the range from 65:35 to 75:25 or more particularly is 67:33.
- (A1_1): PA 610 and/or PA1010, where, in the case of a mixture, the components are used in the ratio of 1:1 to 4:1.
- (A1_2): PA 6I/6T, where the molar ratio is in the range from 65:35 to 75:25 or more particularly is 67:33.
- (A1_1): PA 66
- (A1_2): PA MXD6/MXDI, where the molar ratio in the copolyamide is in the range from 70:30 to 90:10 or more particularly is 88:12.

Here, preferentially, the fraction of component (A1_1) is in each case in the range from 50 to 90 wt %, more particularly from 60 to 85 wt %, and component (A1_2) preferably in the range from 10 to 50 wt %, more particularly in the range from 15 to 40 wt %.

In one particular embodiment, the following compositions are preferred for the polymer mixture (polyamide matrix):
- (A1_1): 55-95 wt % PA 1010 or PA 1012
- (A1_2): 5-45 wt % of PA 6I/6T, the 6I fraction being 62-72 mol %.
- (A1_1): 55-85 wt % PA 610 or PA 612 or PA 1010 or PA 1012 or PA 1210 or PA1212 or PA 11 or PA 12
- (A1_2): 15-45 wt % of PA 6T/6I or PA 10T/10I, the 6I or 10I fraction being 55-80 (preferably 60-75) mol %.
- (A1_1): 70-100 wt %, more preferably 70-90 wt %, of a mixture of PA 6 and PA66, in the ratio of 1:2 to 1:4, more particularly of 1:4
- (A1_2): 0-30 wt %, more preferably 10-30 wt %, of PA 6I/6T, the molar ratio being in the range from 65:35 to 75:25 or more particularly being 67:33.

In one further embodiment, the component A1_2 has a glass transition temperature of greater than 90° C., preferably greater than 110° C. and more preferably greater than 140° C. Especially preferred is the following embodiment:
- (A1_1): 55-85 wt % PA 610 or PA 612 or PA 1010 or PA 1012 or PA 1210 or PA 1212
- (A1_2): 15-45 wt % of PA 6T/6I or PA 10T/10I, the 6I or 10I fraction being 55-80 (preferably 60-75) mol %.

The polyamides of components (A1_1) are preferentially selected from the following group: polyamide 46, polyamide 6, polyamide 66, polyamide 11, polyamide 12, polyamide 1212, polyamide 1010, polyamide 1012, polyamide 1112, polyamide 610, polyamide 612, polyamide 69, polyamide 810.

The moulding compositions further contain 10 to 70 wt %, preferably 15 to 60 wt % and more preferably 18 to 55 wt % of fibrous adjuvants, preferably in the form of glass fibres (component B), which are used, for example, in the form of short fibres (e.g. chopped glass with a length of 0.2-20 mm) or continuous fibres (rovings). The glass fibres (B) may have different cross-sectional areas, with preference being given to glass fibres having a circular cross-section (round fibres) and with a non-circular cross-section (flat fibres).

Glass fibres with a circular cross-section, i.e. round glass fibres, have a diameter in the range of 5-20 μm, preferably in the range of 6-13 μm and more preferably in the range of 6-10 μm. They are used preferably as short glass fibres (chopped glass having a length of 0.2 to 20 mm, preferably 2-12 mm).

In the case of the flat glass fibres, i.e. glass fibres with a non-circular cross-sectional area, use is made preferably of those having a dimension ratio of the principal cross-sectional axis to the secondary cross-sectional axis situated perpendicular thereto of more than 2.5, preferably in the range from 2.5 to 6, more particularly in the range from 3 to 5. These so-called flat glass fibres have an oval, elliptical, constricted elliptical (cocoon fibre), polygonal, rectangular or virtually rectangular cross-sectional area. Another characterizing feature of the flat glass fibres used is that the length of the principal cross-sectional axis is preferably in the range from 6 to 40 μm, more particularly in the range from 15 to 30 μm, and the length of the secondary cross-sectional axis is in the range from 3 to 20 μm, more particularly in the range from 4 to 10 μm. The flat glass fibres here have a very high packing density, meaning that the cross-sectional area of the glass fills an imaginary rectangle, surrounding the cross section of the glass fibre as exactly as possible, to an extent of at least 70%, preferably at least 80% and especially preferably at least 85%.

In order to reinforce the moulding compositions of the invention, it is also possible to use mixtures of glass fibres with circular and non-circular cross-sections, in which case the fraction of flat glass fibres is preferably predominant, accounting thus for more than 50 wt % of the total mass of the fibres.

Component (B) is preferably selected from the group consisting of the following: E glass fibres (which according to ASTM D578-00 consist of 52-62% silicon dioxide, 12-16% aluminium oxide, 16-25% calcium oxide, 0-10% borax, 0-5% magnesium oxide, 0-2% alkali metal oxides, 0-1.5% titanium dioxide and 0-0.3% iron oxide; they preferably have a density of 2.58±0.04 g/cm3, a modulus of elasticity in tension of 70-75 GPa, a tensile strength of 3000-3500 MPa and an elongation at break of 4.5-4.8%), A glass fibres (63-72% silicon dioxide, 6-10% calcium oxide, 14-16% sodium and potassium oxides, 0-6% aluminium oxide, 0-6% boron oxide, 0-4% magnesium oxide), C glass fibres (64-68% silicon dioxide, 11-15% calcium oxide, 7-10% sodium and potassium oxides, 3-5% aluminium oxide, 4-6% boron oxide, 2-4% magnesium oxide), D glass fibres (72-75% silicon dioxide, 0-1% calcium oxide, 0-4% sodium and potassium oxides, 0-1% aluminium oxide, 21-24% boron oxide), basalt fibres (mineral fibres with the approximate composition: 52% $SiO_2$, 17% $Al_2O_3$, 9% CaO, 5% MgO, 5% $Na_2O$, 5% iron oxide, and also other metal oxides), AR glass fibres (55-75% silicon dioxide, 1-10% calcium oxide, 11-21% sodium and potassium oxides, 0-5% aluminium oxide, 0-8% boron oxide, 0-12% titanium dioxide, 1-18% zirconium oxide, 0-5% iron oxide) and also mixtures thereof.

A preferred embodiment of component (B) are high-strength glass fibres based on the ternary system silicon dioxide-aluminium oxide-magnesium oxide or on the quaternary system silicon dioxide-aluminium oxide-magnesium oxide-calcium oxide, with the sum of the amounts of silicon dioxide, aluminium oxide and magnesium oxide being at least 78 wt %, preferably at least 87% and more preferably at least 92%, based on the total glass composition.

Used specifically with preference is a composition of 58-70 wt % silicon dioxide ($SiO_2$), 15-30 wt % aluminium oxide ($Al_2O_3$), 5-15 wt % magnesium oxide (MgO), 0-10 wt % calcium oxide (CaO) and 0-2 wt % further oxides, such as zirconium dioxide ($ZrO_2$), boron oxide ($B_2O_3$), titanium dioxide ($TiO_2$) or lithium oxide ($Li_2O$). In another embodiment the high-strength glass fibre possesses a composition of 60-67 wt % silicon dioxide ($SiO_2$), 20-28 wt % aluminium oxide ($Al_2O_3$), 7-12 wt % magnesium oxide (MgO), 0-9 wt % calcium oxide (CaO) and 0-1.5 wt % further oxides, such as zirconium dioxide ($ZrO_2$), boron oxide ($B_2O_3$), titanium dioxide ($TiO_2$), lithium oxide ($Li_2O$).

In particular it is preferred if the high-strength glass fibre has the following composition: 62-66 wt % silicon dioxide ($SiO_2$), 22-27 wt % aluminium oxide ($Al_2O_3$), 8-12 wt % magnesium oxide (MgO), 0-5 wt % calcium oxide (CaO), 0-1 wt % further oxides, such as zirconium dioxide ($ZrO_2$), boron oxide ($B_2O_3$), titanium dioxide ($TiO_2$), lithium oxide ($Li_2O$).

The high-strength glass fibre possesses a tensile strength of greater than or equal to 3700 MPa, preferably of at least 3800 or 4000 MPa, an elongation at break of at least 4.8%, preferably of at least 4.9 or 5.0%, and a modulus of elasticity in tension of greater than 75 GPa, preferably of more than 78 or 80 GPa, these glass properties being for determination on individual fibres (pristine single filament) having a diameter of 10 µm and a length of 12.7 mm, at a temperature of 23° C. and at a relative humidity of 50%. Specific examples of these high-strength glass fibres of component (B1) are S glass fibres from Owens Corning with 995 size, T glass fibres from Nittobo, HiPertex from 3B, HS4 glass fibres from Sinoma Jinjing Fiberglass, R glass fibres from Vetrotex, and S-1 and S-2 glass fibres from AGY.

The glass fibres used in accordance with the invention, for example, as rovings (continuous fibres) have a diameter (for round glass fibres) or a secondary cross-sectional axis (for flat glass fibres) of 8 to 20 µm, preferably of 12 to 18 µm, it being possible for the cross-section of the glass fibres to be round, oval, elliptical, elliptical with constrictions, polygonal, rectangular or virtually rectangular. Particularly preferred are so-called flat glass fibres having a ratio of the cross-sectional axes, i.e. a ratio of principal to secondary cross-sectional axes, of 2.5 to 5. The continuous fibres may be produced from the types of glass described above, with preference being given to continuous fibres based on E glass and on the high-strength glass varieties. These continuous fibres are incorporated into the polyamide moulding compositions of the invention by means of known techniques for producing long fibre-reinforced rod pellets, more particularly by pultrusion techniques, in which the continuous fibre strand (roving) is fully impregnated with the polymer melt and then is cooled and chopped. The long fibre-reinforced rod pellets obtained in this way, with a pellet length of preferably 3 to 25 mm, more particularly of 4 to 12 mm, can be further-processed by the usual processing techniques (such as injection moulding or compression moulding, for example) to form mouldings.

Preferred components (B) are glass fibres of E glass, with a non-circular cross-section (flat fibres) and with an axial ratio of the principal cross-sectional axis to the secondary cross-sectional axis of at least 2.5, more particularly in the range from 3 to 5, and/or high-strength glass fibres with a circular or non-circular cross-section and with a glass composition based essentially on the components silicon dioxide, aluminium oxide and magnesium oxide, with the fraction of magnesium oxide (MgO) being 5-15 wt % and the fraction of calcium oxide being 0-10 wt %.

As flat E glass fibres, the glass fibres of component (B) preferably have a density of 2.54-2.62 g/cm$^3$, a modulus of elasticity in tension of 70-75 GPa, a tensile strength of 3000-3500 MPa and an elongation at break of 4.5-4.8%, the mechanical properties having been determined on individual fibres having a diameter of 10 µm and a length of 12.7 mm, at 23° C. and a relative humidity of 50%.

The glass fibres of the invention may be provided with a size which is suitable for thermoplastics, more particularly for polyamide, comprising an adhesion promoter based on an amino- or epoxy-silane compound.

The fraction of component (C) is preferably in the range of 0.5-8 wt %, more preferably in the range of 1-6 wt %.

Component (C) is preferably an LDS additive having a non-zero absorption coefficient for UV, VIS or IR radiation, which on exposure to electromagnetic radiation, preferably in the form of laser radiation, forms metal seeds which, in a chemical metalizing procedure, facilitate and/or permit and/or enhance the deposition of metal layers for the generation of conductor tracks at their radiated locations on the surface of the moulding, the LDS additive preferably having a capacity for absorption in the visible and infrared radiation regions, with an absorption coefficient of at least 0.05, preferably at least 0.1 and more particularly at least 0.2, and/or in that an absorber is provided which transmits the radiant energy to the LDS additive.

Component (C) is preferably an LDS additive having an average particle size (D50) in the range of 50-20 000 nanometres, preferably 200 to 15 000 nanometres and more preferably 300 to 5000 nanometres. The D50 value, stated as a measure of the particle size, is a measure of the average particle size, with 50 volume percent of the sample being finer, and the other 50% of the sample being coarser, than the D50 (median).

Component (C) preferably comprises an LDS (Laser Direct Structuring) additive selected from the group of metal oxides, mixed metal oxides, metal hydroxide oxides, metal sulphide oxides based on antimony, copper, neodymium, molybdenum, bismuth or tin, with the exclusion of spinels, such as copper, chromite, for example (copper chromium oxide, Shepard Black). Particularly preferred are tin oxide, antimony oxide, mixtures of tin oxide and antimony oxide, bismuth neodymate ($Bi_2O_3.Nd_2O_3$), copper molybdate ($CuO.xMoO_3$), mixtures of tin oxide and indium oxide, and mixtures of tin oxide and tin fluoride.

Particularly preferred is tin oxide and doped tin oxide, in which case the doping may take place with antimony, indium, bismuth, molybdenum, aluminium, titanium, silicon, iron, copper, silver, nickel and cobalt. Especially preferred is tin oxide which is doped with antimony, titanium or copper. Further preferred are mixtures of tin oxide and at least one further metal oxide, more particularly antimony oxide, as LDS additives. Further metal oxides used in this case are not only colourless metal oxides of high refractive index, such as, in particular, titanium dioxide antimony(III) oxide, zinc oxide, tin oxide and/or zirconium dioxide, but also coloured metal oxides such as, for example, chromium oxide, nickel oxide, copper oxide, cobalt oxide and, in particular, iron oxide ($Fe_2O_3$, $Fe_3O_4$). Especially preferred for use is the mixture of tin oxide and antimony(III) oxide.

The doped tin oxides and/or metal oxide mixtures and/or tin oxide are preferably formed as layers on platelet-shaped substrates, more particularly phyllosilicates, such as, for example, synthetic or natural mica, talc, kaolin, glass flakes or $SiO2$ platelets. Preferred substrates for the metal oxides are, in particular, mica or else mica flakes. Additionally contemplated as substrates are platelet-shaped metal oxides such as, for example, platelet-shaped iron oxide, aluminium oxide, titanium dioxide, silicon dioxide, LCP's (Liquid Crystal Polymers), holographic pigments or coated graphite platelets.

Furthermore, component (C) is preferably selected from phosphates, condensed phosphates, phosphonates, phosphites and mixed hydroxide-phosphate oxo anions of copper (Cu), tin (Sn) and/or iron (Fe), more particularly from metal phosphates, alkaline metal phosphates or metal hydroxide phosphates, preferably based on inorganic compounds of copper and/or of tin, more particularly tritin phosphate (CAS 15578-32-3), tricopper phosphate (CAS 7798-23-4), copper diphosphate (CAS 10102-90-6), copper hydroxide phosphate (CAS 12158-74-6), copper tin phosphate and mixtures thereof.

Particularly preferred LDS additives are alkaline copper phosphate, copper hydroxide phosphate, copper tin phosphate, alkaline copper tin phosphate, tin phosphate, alkaline tin phosphate and antimony-doped tin oxide, the latter being used preferably in combination with mica. Particularly preferred are LDS additives based on mica, the mica surface having a coating of metal-doped tin oxides, since these additives permit greater colour lightness in the moulding composition. Especially preferred is antimony-doped tin oxide.

Examples of commercially available LDS additives in accordance with the present invention are as follows: Iriotec 8820, 8825, 8830 and Minatec 230 A-IR from Merck, Stanostat CP40W, Stanostat CP15G, and Stanostat CP5C from Keeling & Walker.

Component (C) may therefore comprise an LDS additive selected from the following group: doped tin oxides, preferably antimony-doped tin oxides; metal oxide mixtures with tin oxide, formed as layers on platelet-shaped substrates, more particularly phyllosilicates, such as preferably synthetic or natural mica, talc, kaolin, glass flakes or $SiO2$ platelets; metal-doped or metal oxide-doped tin oxide; metal oxide-coated mica; mica coated with antimony-doped tin oxide; mixture of tin oxide and antimony oxide and optionally further metal oxides; copper chromium oxide; copper oxide; copper hydroxide; copper hydroxide phosphate; copper phosphate; alkaline copper phosphates; copper tin phosphate, alkaline copper tin phosphate; tin phosphate; alkaline tin phosphate; or a mixture of such LDS additives.

The moulding compositions of the invention contain 0.1 to 20, preferably 0.5 to 10 and more preferably 1 to 8 wt %, more preferably in the range of 2-6 wt % or 2-5 wt %, of inorganic white pigments (component (D)). Component (D) is or consists exclusively of the inorganic white pigments, selected from the group of barium sulphate, zinc oxide, zinc sulphide, lithopone, titanium zinc mixed oxides and titanium dioxide (rutile, anatase), the white pigments preferentially possessing an average particle size (D50) in the range of 0.1-40 µm, preferably in the range of 0.1-20 µm, more particularly in the range of 0.1-10 µm. Particularly preferred is zinc sulphide, and particularly preferably only this zinc sulphide is used as component (D). The metal oxides used as component D are different from components C and E.

One preferred embodiment is characterized in that component (D) is free from titanium dioxide.

The fraction of component (E) is preferably in the range of 0-18 wt %, more preferably in the range of 0-15 wt % and very preferably in the range of 2-15 wt % or 3-10 wt %. Talc, chalk or calcium carbonate, for example, may make it easier to generate metal seeds.

Suitable particulate fillers of component (D) include all fillers known to the skilled person. These include, in particular, particulate fillers selected from the group consisting of talc (magnesium silicate), mica, silicates, quartz, wollastonite, kaolin, silicas, magnesium carbonate, magnesium hydroxide, chalk, ground or precipitated calcium carbonate, lime, feldspar, inorganic pigments other than components C and D, such as iron oxide or iron manganese oxide, for example, permanently magnetic or magnetizable metals or alloys, hollow-sphere silicate fillers, aluminium oxide, boron nitride, boron carbide, aluminium nitride, calcium fluoride and mixtures thereof. The fillers may also be in surface-treated form.

These fillers (component E) have an average particle size (D50) in the range of 0.1-40 µm, preferably in the range of 0.2-20 µm, more particularly in the range of 0.3-10 µm. Preference is given to a particulate filler morphology wherein the aspect ratios $L/b1$ and $L/b2$ are both not more than 10, in particular not more than 5, the aspect ratios being described by the ratio of greatest length L of the particle to its average width $b1$ or $b2$. Here, $b1$ and $b2$, which are arranged perpendicularly to one another, lie within a plane perpendicular to the length L.

Moreover, the thermoplastic polyamide moulding compositions of the invention may further comprise customary additives, generally known to the skilled person, in the form of the additives (F), which are selected preferably from the group consisting of the following: adhesion promoters, stabilizers, aging inhibitors, antioxidants, antiozonants, light stabilizers, UV stabilizers, UV absorbers, UV blockers, inorganic heat stabilizers, especially based on copper halides and alkali metal halides, organic heat stabilizers, conductivity additives, carbon black, optical brighteners, processing assistants, nucleating agents, crystallization accelerators, crystallization retarders, flow assistants, lubricants, mould release agents, plasticizers, organic pigments and dyes, marker substances and mixtures thereof.

The invention relates further to a component, more particularly a component with electrical conductor tracks, on the basis of a moulding composition as set out above. Fields of use for the MID technology are in automotive engineering, industrial automation, medical engineering, the domestic appliance industry, consumer electronics, the telecommunications industry, analysis and metrology, mechanical engineering, and also air and space travel. The invention thus also relates to an article more particularly a circuit carrier, comprising a moulding produced from the moulding composition of the invention. In one embodiment, the circuit carrier is utilized in order to form an antenna.

Such mouldings are, for example, housings or housing parts for portable electronics, such as PDAs, mobile telephones, other telecommunication devices, housings or housing parts for personal computers, notebooks, medical devices, such as hearing devices, for example, sensor technology, or RFID (Radio Frequency IDentification) transponders or parts for the automotive sector, such as, for example, airbag module, multi-function steering wheel.

On account of the extensive possibilities for design with plastics injection moulding, three-dimensional circuit carriers can be realized. Furthermore, typical mechanical functions can be integrated, such as mounts, guides, buttons, plugs or other connecting elements. Likewise possible are connectors for E/E and for fuel systems.

Further embodiments are specified in the dependent claims.

BRIEF DESCRIPTION OF THE DRAWINGS

Preferred embodiments of the invention are described below by means of the drawings; in the drawings.

DESCRIPTION OF PREFERRED EMBODIMENTS

The invention is to be described hereinafter using specific working examples (B), and compared with the less effective systems of the prior art (VB). The working examples specified below serve to support the invention and to demonstrate the differences relative to the prior art, but they are not intended to limit the general subject matter of the invention, as defined in the claims.

Examples B1 to B17 and Comparative Examples VB1 to VB6

The components specified in Tables 2 and 3 are compounded in a twin-screw extruder from Werner and Pfleiderer having a screw diameter of 25 mm, with specified processing parameters (cf. Table 1). The polyamide pellets along with the additives are metered into the intake zone, while the glass fibre is metered into the polymer melt via a side feeder 3 barrel units ahead of the die. The compounds are taken off as extrudate from a nozzle 3 mm in diameter, and pelletized after water cooling. The pellets were dried at 110° C. under a reduced pressure of 30 mbar for 24 hours. The compounded formulations are injection-moulded on an Arburg Allrounder 320-210-750 machine to give sample bodies with defined cylinder temperatures for zones 1 to 4 and with a defined mould temperature (see Table 1).

TABLE 1

| Compounding and injection moulding conditions for the inventive and comparative examples | | |
|---|---|---|
| Compounding/processing parameters | | B1-B17, VB1-VB6 |
| Compounding | Barrel temperatures [° C.] | 250-280 |
| | Screw speed [rpm] | 200 |
| | Throughput [kg/h] | 15 |
| Injection moulding | Cylinder temperatures [° C.] | 280 |
| | Mould temperature [° C.] | 80 |

TABLE 2

| Composition and properties of Examples B1 to B8 | | | | | | | | | |
|---|---|---|---|---|---|---|---|---|---|
| | Units | B1 | B2 | B3 | B4 | B5 | B6 | B7 | B8 |
| Composition | | | | | | | | | |
| PA1010 | wt % | 35.5 | 35.7 | 34.0 | 35.5 | 34.2 | 34.2 | 34.2 | 34.2 |
| PA 6I/6T | wt % | 11.8 | 11.9 | 11.3 | | 8.5 | 8.5 | 8.5 | 8.5 |
| PA 10I/10T | wt % | | | | 11.8 | | | | |
| Glass fibre type B | wt % | 50 | 50 | 50 | 50 | 50 | 50 | 50 | 50 |
| LDS additive 1 | wt % | 1.4 | 1.0 | 1.4 | 1.4 | 4 | 4 | | |
| LDS additive 3 | | | | | | | | 4 | 4 |
| Zinc sulphide | wt % | 1.0 | 1.1 | 3.0 | 1.0 | 3 | | 3 | |
| Titanium dioxide | wt % | | | | | | 3 | | 3 |
| Irganox 1098 | wt % | 0.3 | 0.3 | 0.3 | 0.3 | 0.3 | 0.3 | 0.3 | 0.3 |
| Properties | | | | | | | | | |
| MET[1)] | MPa | 14 500 | 14 300 | 14 800 | 12 500 | 16 000 | 15 000 | 15 800 | 14 700 |
| Tensile strength | MPa | 183 | 182 | 182 | 134 | 185 | 146 | 175 | 140 |
| Elongation at break | % | 2.7 | 2.7 | 2.6 | 3.5 | 2.2 | 1.7 | 2.1 | 1.7 |
| Impact strength 23° C. | kJ/m$^2$ | 82 | 85 | 81 | 83 | 64 | 42 | 57 | 46 |

TABLE 2-continued

Composition and properties of Examples B1 to B8

|  | Units | B1 | B2 | B3 | B4 | B5 | B6 | B7 | B8 |
|---|---|---|---|---|---|---|---|---|---|
| Notched impact strength 23° C. | kJ/m² | 17 | 17 | 15 | 20 | 15 | 8 | 12 | 10 |
| Metallizability (fraction of metallized fields) | % | 97 | 91 | 97 | 97 | 100 | 100 | 88 | 91 |
| Colour (subjective colour impression) |  | white | white | white | white | white | white | white (green) | white |
| Colour lightness L* |  | 72 | 73 | 79 | 76 | 80 | 82 | 70 | 75 |

[1)] MET = Modulus of Elasticity in Tension

TABLE 3

Composition and properties of comparative examples VB1 to VB6 and B9

|  | Units | VB1 | VB2 | VB3 | VB4 | VB5 | VB6 | B9 |
|---|---|---|---|---|---|---|---|---|
| Composition | | | | | | | | |
| PA1010 | wt % | 36.6 | 36.6 | 36.6 | 52.4 | 44.4 | 34.2 | 42.7 |
| PA 6I/6T | wt % | 9.1 | 9.1 | 9.1 | 13.3 | 11.3 | 8.5 |  |
| LDS additive 1 | wt % |  |  |  |  |  |  | 4 |
| LDS additive 2 | wt % | 4 | 4 | 4 | 4 | 4 | 4 |  |
| Glass fibre type A | wt % |  | 50 |  |  |  |  |  |
| Glass fibre type B | wt % | 50 |  |  | 30 | 30 | 50 | 50 |
| Glass fibre type C | wt % |  |  | 50 |  |  |  |  |
| Zinc sulphide | wt % |  |  |  |  |  |  | 3 |
| Titanium dioxide | wt % |  |  |  |  |  | 3 |  |
| Talc | wt % |  |  |  |  | 10 |  |  |
| Irganox 1098 | wt % | 0.3 | 0.3 | 0.3 | 0.3 | 0.3 | 0.3 | 0.3 |
| Properties | | | | | | | | |
| MET[1)] | MPa | 14 400 | 14 300 | 16 100 | 8 300 | 11 000 | 14 000 | 15 600 |
| Tensile strength | MPa | 145 | 146 | 167 | 111 | 122 | 116 | 178 |
| Elongation at break | % | 1.9 | 2.2 | 2.4 | 2.5 | 1.9 | 1.5 | 2.2 |
| Impact strength 23° C. | kJ/m² | 58 | 56 | 58 | 42 | 38 | 32 | 68 |
| Notched impact strength 23° C. | kJ/m² | 11 | 10 | 11 | 9 | 8 | 7 | 16 |
| Metallizability (fraction of metallized fields) | % | 100 | 100 | 100 | 100 | 100 | 100 | 91 |
| Colour (subjective colour impression) |  | black | black | black | black | black | grey | white |
| Colour lightness L* |  | 31 | 31 | 32 | 31 | 32 | 42 | 82 |

[1)] MET = Modulus of Elasticity in Tension

TABLE 4

Composition and properties of examples B10 to B17

|  | Units | B10 | B11 | B12 | B13 | B14 | B15 | B16 | B17 |
|---|---|---|---|---|---|---|---|---|---|
| Composition | | | | | | | | | |
| PA 6 | wt % | 34 |  |  |  |  |  |  |  |
| PA 66 | wt % |  | 32.5 |  |  |  | 8 | 48 | 15 |
| PA 610 | wt % |  |  | 32.5 | 48 |  | 40 |  | 33 |
| PA 612 | wt % |  |  |  |  | 32.5 |  |  |  |
| PA 6I/6T | wt % | 11 | 10.5 | 10.5 | 16 | 10.5 | 16 | 16 | 16 |
| Glass fibre type B | wt % | 50 | 50 | 50 | 30 | 50 | 30 | 30 | 30 |
| LDS additive 1 | wt % |  |  |  |  | 3.5 |  |  |  |
| LDS additive 4 | wt % | 1.2 | 1.2 | 3.5 | 4 |  | 4 | 4 | 4 |
| LDS additive 5 | wt % | 2.5 | 4.0 |  |  |  |  |  |  |
| Zinc sulphide | wt % | 1.0 |  | 3.2 | 1.7 |  | 1.7 | 1.7 | 1.7 |
| Titanium dioxide | wt % |  | 1.5 |  |  | 3.2 |  |  |  |
| Irganox 1098 | wt % | 0.3 | 0.3 | 0.3 | 0.3 | 0.3 | 0.3 | 0.3 | 0.3 |

TABLE 4-continued

Composition and properties of examples B10 to B17

| | Units | B10 | B11 | B12 | B13 | B14 | B15 | B16 | B17 |
|---|---|---|---|---|---|---|---|---|---|
| Properties | | | | | | | | | |
| MET | MPa | 15 500 | 16 600 | 14 200 | 8 600 | 15 300 | 8 800 | 9 500 | 9 200 |
| Tensile strength | MPa | 153 | 170 | 152 | 130 | 164 | 130 | 146 | 132 |
| Elongation at break | % | 1.8 | 1.7 | 2.0 | 2.6 | 2.1 | 2.3 | 2.1 | 2.4 |
| Impact strength 23° C. | kJ/m$^2$ | 40 | 40 | 50 | 35 | 66 | 35 | 32 | 38 |
| Notched impact strength 23° C. | kJ/m$^2$ | 10 | 8 | 9 | 8 | 8 | 8 | 7 | 9 |
| Metallizability (fraction of metallized fields) | % | 88 | 91 | 91 | 97 | 94 | 100 | 97 | 100 |
| Colour (subjective colour impression) | | white | white | white | white | white | white | white | white |
| Colour lightness L* | | 74 | 76 | 82 | 76 | 84 | 77 | 76 | 77 |

Key, Materials:

PA 6I/6T (70:30) Amorphous, partially aromatic polyamide based on terephthalic acid, isophthalic acid and 1,6-hexanediamine, having a glass transition temperature of 125° C. and a solution viscosity of 1.54.

PA 10I/10T (60:40) Amorphous, partially aromatic polyamide based on 1,10-decanediamine, isophthalic acid and terephthalic acid, having a glass transition temperature of 101° C. and a solution viscosity of 1.59.

PA 1010 Partially crystalline, aliphatic polyamide based on 1,10-decanediamine and sebaccic acid, having a melting point of 200° C. and a solution viscosity of 1.78.

PA 6 Partially crystalline, aliphatic polyamide based on caprolactam, having a melting point of 225° C. and a solution viscosity of 1.90.

PA 66 Partially crystalline, aliphatic polyamide based on 1,6-hexanediamine and adipic acid, having a melting point of 260° C. and a solution viscosity of 1.85.

PA 610 Partially crystalline, aliphatic polyamide based on 1,6-hexanediamine and sebaccic acid, having a melting point of 223° C. and a solution viscosity of 1.88.

PA 612 Partially crystalline, aliphatic polyamide based on 1,6-hexanediamine and dodecanedioic acid, having a melting point of 217° C. and a solution viscosity of 1.84.

Glass fibre type A Vetrotex 995 chopped E glass fibres, with a length of 4.5 mm and a diameter of 10 μm (circular cross-section) from Owens Corning Fiberglass Glass fibre type B CSG3PA-820 chopped E glass fibres, with a length of 3 mm, a principal cross-sectional axis of 28 μm, a secondary cross-sectional axis of 7 μm, an axial ratio of 4 (non-circular cross-section) from NITTO BOSEKI, Japan Glass fibre type C: GF O.C. HPXSS PAX95 10-4 (Owens Corning (US))

LDS additive 1 Iriotec 8825, tin oxide and antimony oxide on mica, Merck

LDS additive 2 Copper chromite, (Shepherd)

LDS additive 3 Tin-based metal phosphate, Fabulase 330 (Budenheim)

LDS additive 4 Irotec 8850, tin/antimony oxide on titanium dioxide, Merck

LDS additive 5 Minatec 230 A-IR, tin antimony cassiterite (CAS 68187-54-2), Merck Titanium dioxide KRONOS 2222 titanium dioxide, white pigment. >92.5% titanium dioxide. Rutile. Coating: Al, Si, polysiloxane. $d_{50}$ 0.21 μm. D 4.0 g/cm$^3$.

Zinc sulphide Sachtolith HD-S zinc sulphide (Sachtleben), average particle size in the range from 0.30 to 0.35 μm.

Talc Microtalc IT Extra Mondo Minerals

The measurements were carried out in accordance with the following standards and on the following test specimens.

(Thermo-)Mechanical Parameters:

The modulus of elasticity in tension was determined in accordance with ISO 527 with a tensioning speed of 1 mm/min, and the yield stress, tensile strength and elongation at break were determined according to ISO 527 with a tensioning speed of 5 mm/min (non-reinforced versions) or with a tensioning speed of 5 mm/min (reinforced versions) at a temperature of 23° C., the sample body used being an ISO tension dumbbell, standard: ISO/CD 3167, Type A1, 170×20/10×4 mm.

Impact strength and Charpy notched impact strength were measured according to ISO 179 on an ISO test rod, standard: ISO/CD 3167, Type B1, 80×10×4 mm at 23° C. temperature.

The thermal characteristics (melting temperature ($T_m$), enthalpy of fusion ($\Delta H_m$), glass transition temperature ($T_g$)) were determined on the basis of ISO standard 11357-11-2 on the pellets. Differential Scanning calorimetry (DSC) was carried out with a heating rate 20° C./min. For the glass transition temperature ($T_g$), the temperature for the middle stage or point of inflection is reported.

The relative viscosity ($\eta_{rel}$) was measured according to DIN EN ISO 307 at 20° C. using 0.5 wt % strength m-cresol solutions. The sample used comprises pellets.

Deviations from this are stated in the description.

The heat distortion resistance in the form of HDT A (1.8 MPa) and HDT B (0.45 MPa) was determined according to ISO 75 on ISO impact rods with dimensions of 80×10×4 mm.

Laser Structurability:

In order to assess the metalizing behaviour, injection mouldings (plate 60×60×2 mm) were structured using an Nd:YAG laser and thereafter subjected to electroless metallization in a copperizing bath. In the laser structuring, 18 adjacent regions measuring 4×4 mm on the surface of the moulding were irradiated. Laser structuring took place using a Trumpf TruMark Station 5000 laser at a wavelength of 1064 nm with a speed in the range from 300 to 7200 mm. In the course of this structuring, variations were made both in the pulse frequency, as in the range of 10-80 kHz, and in the hatch (pulse overlap), in the range from 0.03 to 0.09 mm. Following the laser structuring, the mouldings are subjected to a cleaning operation in order to remove laser processing residues. The mouldings then pass in succession through ultrasound baths with surfactant and with deionized water. After cleaning, the mouldings are metallized in succession in reductive copperizing baths (MID Copper 100 XB Strike and MID Copper 100 XB Build, Mac Dermid) at 55 to 65° C. The residence time in the strike bath is 20 min and in the build bath is 1-3 h. The rate of copper deposition (thickness of the copper layer) in the MID Copper 100 XB Build bath on the laser-irradiated areas amounts on average to 3 to 5 µm/h.

Figure 1:
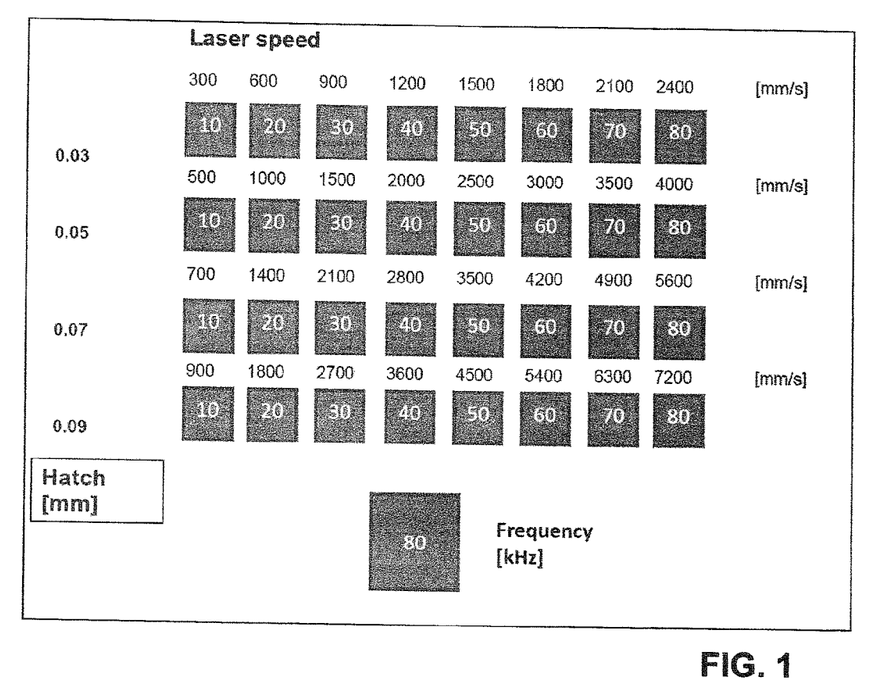
FIG. 1 shows the parameters of the laser structuring.
Figure 2:
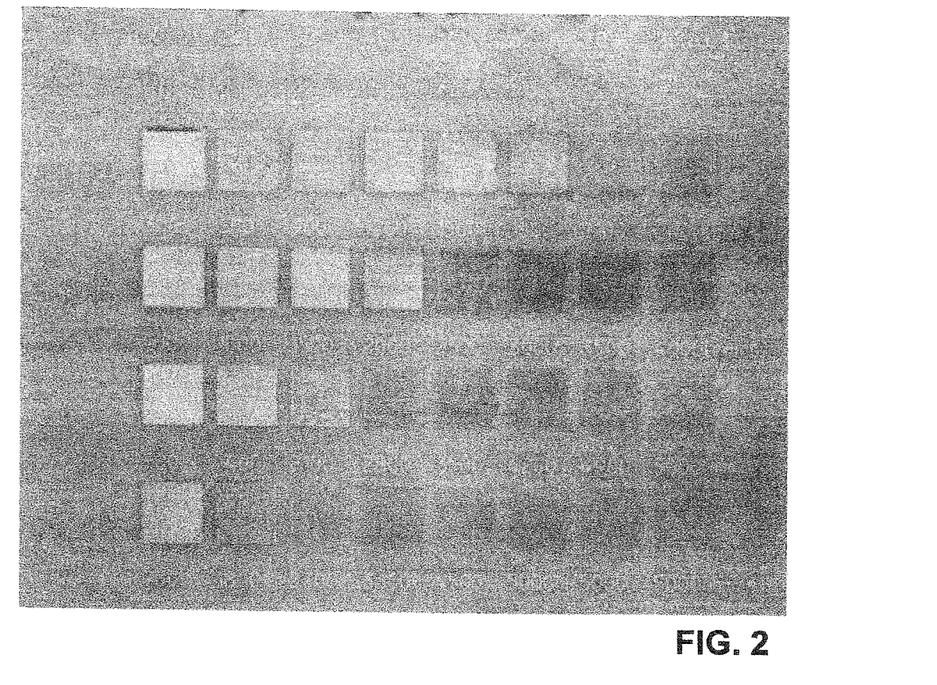
FIG. 2 shows a specimen plate after laser activation and metalizing.

Metalizability:

The metalizability was calculated as the ratio between metallized fields and the total number of fields. In total, 32 fields per sample plate are structured with the laser using different parameters, as shown in FIG. 1, and are subsequently metallized as described above. Metallized fields are only those fields which were metallized completely and uniformly in the operation described above. FIG. 2 shows a sample plate after laser structuring and metalizing, in which the fields beneath the diagonal from the bottom left to the top right were either not metallized or not sufficiently metallized—that is metallized incompletely or non-uniformly.

For all moulded interconnect device (MID) technologies, chemical reductive copper deposition is the key initial metalizing operation which is decisive for the quality of the overall layer. It is therefore entirely adequate to assess the quality of the primary metal layer. In order to arrive at the completed MID part, generally nickel and subsequently a final layer of immersion gold will be deposited on the basis of the first copper layer (primary layer). It will be appreciated that other metal layers as well, such as further layers of copper, palladium, tin or silver, may also be applied to the primary layer.

Colour Lightness L*:

The CIE L*a*b* values (DIN 6174) of sample bodies with dimensions of 2×40×50 mm (colour plaques) were determined using a Datacolor spectrophotometer (instrument designation: Datacolor 650) against a white-coated metal contrast panel, under measuring conditions as follows: measurement mode: reflection, measurement geometry: D/8°, illuminant: D 65 10, gloss: included, calibration: UV-calibrated, aperture plate: SAV. The colour plaques used for colorimetry were injection-moulded from the materials of the inventive and comparative examples on an all-electric injection-moulding machine from Arburg (apparatus designation: ARBURG Allrounder 320 A 500-170) with heated mould. The injection moulding parameters are listed in Table 1.

The inventive examples, for which LDS additive 1 or 3 was used, have significantly better mechanical properties, more particularly a higher tensile strength, elongation at break, impact strength and notched impact strength, than the comparative attempts produced using LDS additive 1, particularly when white pigments are used at the same time, as shown by the comparison of B6 with VB6. In parallel to this, the moulding compositions of the invention have the same or similarly good metalizability and have a lighter intrinsic colour, as reflected in much higher colour lightness values L*. Thus for VB6 metalizability of 100% and a colour lightness L* of 42 are found, whereas for B6 the metalizability is likewise 100%, but the colour lightness adopts a much higher value, of 82. Comparing B5 with B6 and B7 with B8 it is found that with the same LDS additive, using zinc sulphide as white pigment instead of titanium dioxide, the mechanical properties that result are consistently better.

The invention claimed is:

1. A thermoplastic moulding composition consisting of:
(A) 43-80 wt % consisting of:
  (A1) a mixture of thermoplastics consisting of:
    (A1_1) 55-85 wt % of aliphatic polyamide selected from the group consisting of polyamide 1010, polyamide 610, polyamide 612, mixtures thereof, copolymers thereof, blends thereof and alloys thereof,
    (A1_2) 15-45 wt % of amorphous, partially aromatic polyamide, selected from the group consisting of: 6I/6T, 10I/10T, copolymers thereof, blends thereof, and alloys thereof, with a composition range T:I of 20:80 to 45:55, the sum of components (A1_1) and (A1_2) adding up to 100 wt % of component (A1);
(B) 18-55 wt % of fibrous adjuvants in the form of glass fibres;
(C) 1-6 wt % of an LDS additive or of a mixture of LDS additives, at least one LDS additive being selected from the following group:
  metal oxide based on antimony, copper, or tin or mixtures thereof, with the proviso that spinels are excluded; copper phosphate, tin phosphate, copper hydroxide phosphate, and tin hydroxide phosphate,
(D) 1-5 wt % of white pigment formed exclusively by zinc sulphide;
(E) 0 wt % of particulate filler other than C or D;
(F) 0-2 wt % of further, different additives;
the sum of (A) (F) making up 100 wt %.

2. The moulding composition according to claim 1, wherein component (C) is an LDS additive having an average particle size ($d_{50}$) in the range of 50-20 000 nanometres.

3. A component formed from a moulding composition according to claim 1.

4. The moulding composition according to claim 1, wherein the glass fibres of component (B) are present in the form of short fibres or in the form of continuous fibres.

5. The moulding composition according to claim 1, wherein the glass fibres of component (B) are present in the form of short fibres, in the form of chopped glass having a length in the range of 0.2-20 mm, or in the form of continuous fibres.

6. The moulding composition according to claim 1, wherein component (B) is formed by glass fibres, in the form of E-glass fibres according to ASTM D578-00.

7. The moulding composition according to claim 1, wherein component (B) is formed by glass fibres, in the form of E-glass fibres according to ASTM D578-00 with a non-circular cross-section.

8. The moulding composition according to claim 1, wherein component (B) is formed by glass fibres, in the form of E-glass fibres according to ASTM D578-00 with a non-circular cross-section, the dimension ratio of the main cross-sectional axis to the secondary cross-sectional axis perpendicular thereto is more than in the range from 3 to 5.

9. The moulding composition according to claim 1, wherein component (B) is formed by glass fibres, in the form of E-glass fibres according to ASTM D578-00 composed of 52-62% silicon dioxide, 12-16% aluminium oxide, 16-25% calcium oxide, 0-10% borax, 0-5% magnesium oxide, 0-2% alkali metal oxides, 0-1.5% titanium dioxide and 0-0.3% iron oxide.

10. The moulding composition according to claim 1, wherein component (B) is formed by glass fibres, in the form of high-strength glass fibres based on the ternary system silicon dioxide-aluminium oxide-magnesium oxide or on the quaternary system silicon dioxide-aluminium oxide-magnesium oxide-calcium oxide.

11. The moulding composition according to claim 1, wherein component (B) is formed by glass fibres in the form of high-strength glass fibres based on the ternary system silicon dioxide-aluminium oxide-magnesium oxide or on the quaternary system silicon dioxide-aluminium oxide-magnesium oxide-calcium oxide, in which case they have the following composition: 58-70 wt %, silicon dioxide ($SiO_2$), 15-30 wt %, aluminium oxide ($Al_2O_3$), 5-15 wt %, magnesium oxide (MgO), 0-10 wt %, calcium oxide (CaO) and 0-2 wt %, further oxides, including zirconium dioxide ($ZrO_2$), boron oxide ($B_2O_3$), titanium dioxide ($TiO_2$) or lithium oxide ($Li_2O$) or a combination of these oxides.

12. The moulding composition according to claim 1, wherein component (C) is an LDS additive having an average particle size ($d_{50}$) in the range of 300 to 5000 nanometres.

13. The moulding composition according to claim 1, wherein the fraction of component (D) is in the range of 2-5 wt %.

14. A component with electrical conductor tracks, formed from the moulding composition according to claim 1, wherein said component is a casing or casing part for portable electronic devices, or a medical device, or a sensor, or an RFID transponder or a part for the automotive sector.

15. A component with electrical conductor tracks, formed from the moulding composition according to claim 1, wherein said component is (i) a casing or casing part for portable electronic devices selected from the group consisting of PDAs, mobile telephones, and telecommunications devices, (ii) a casing or casing part for a device selected from the group consisting of personal computers and notebooks, (iii) a casing or casing part for a medical device selected from the group consisting of hearing devices, sensor technology, and RFID transponders, or (iv) parts for an automotive sector selected from the group consisting of airbag module and multi-function steering wheel.

* * * * *